(12) United States Patent
Yamakoshi

(10) Patent No.: US 11,325,848 B2
(45) Date of Patent: May 10, 2022

(54) ULTRAVIOLET IRRADIATION DEVICE AND METHOD

(71) Applicant: PHOTOSCIENCE JAPAN CORPORATION, Tokyo (JP)

(72) Inventor: Yuji Yamakoshi, Taito-ku (JP)

(73) Assignee: PHOTOSCIENCE JAPAN CORPORATION, Tokyo (JP)

( * ) Notice: Subject to any disclaimer, the term of this patent is extended or adjusted under 35 U.S.C. 154(b) by 565 days.

(21) Appl. No.: 16/330,416

(22) PCT Filed: Aug. 24, 2017

(86) PCT No.: PCT/JP2017/030340
§ 371 (c)(1),
(2) Date: Mar. 5, 2019

(87) PCT Pub. No.: WO2018/047629
PCT Pub. Date: Mar. 15, 2018

(65) Prior Publication Data
US 2021/0276887 A1   Sep. 9, 2021

(30) Foreign Application Priority Data

Sep. 9, 2016  (JP) .............................. JP2016-176898

(51) Int. Cl.
*C02F 1/32* (2006.01)
*B01J 19/12* (2006.01)
(Continued)

(52) U.S. Cl.
CPC .............. *C02F 1/325* (2013.01); *B01J 19/123* (2013.01); *H01L 33/648* (2013.01); *C02F 2103/04* (2013.01); *C02F 2201/3222* (2013.01)

(58) Field of Classification Search
CPC ...... C02F 1/32; C02F 1/46; C02F 1/72; A61L 2/26; A61L 2/10
See application file for complete search history.

(56) References Cited

U.S. PATENT DOCUMENTS

| 6,340,824 B1 | 1/2002 | Komoto et al. |
| 2005/0069463 A1* | 3/2005 | Kurtz ........................ F24F 3/16 422/121 |

(Continued)

FOREIGN PATENT DOCUMENTS

| CN | 104803445 A | 7/2015 |
| JP | H05248788 A | 9/1993 |

(Continued)

OTHER PUBLICATIONS

Office Action issued in Chinese Appln. No. 201780055405.7 dated Sep. 1, 2020. English translation provided.

(Continued)

*Primary Examiner* — Walter D. Griffin
*Assistant Examiner* — Cameron J Allen
(74) *Attorney, Agent, or Firm* — Rossi, Kimms & McDowell LLP

(57) ABSTRACT

The inventive device efficiently cools, with a simple construction, heat generated from an ultraviolet light-emitting diode (UV-LED). The UV-LED is accommodated in a housing that has an open end and an ultraviolet-transparent closing end. A portion of the housing adjacent to the closing end contacts to-be-treated liquid, ultraviolet rays generated from the UV-LED are irradiated to the to-be-treated liquid, and the housing is cooled by the to-be-treated liquid. In this way, the heat generated from the UV-LED can be cooled with a simple construction without use of arrangements for introducing dedicated cooling fluid for cooling the UV-LED. A heat discharge block for discharging to the outside the heat generated from the UV-LED may be provided at or adjacent to the open end of the housing. Further, the present invention may be constructed in such a manner that a portion of the discharge section directly contacts the to-be-treated liquid.

10 Claims, 5 Drawing Sheets

(51) Int. Cl.
  *H01L 33/64* (2010.01)
  *C02F 103/04* (2006.01)

(56) References Cited

U.S. PATENT DOCUMENTS

| | | | |
|---|---|---|---|
| 2005/0152146 A1* | 7/2005 | Owen | A61L 9/20 |
| | | | 362/294 |
| 2009/0084734 A1* | 4/2009 | Yencho | C02F 1/325 |
| | | | 210/741 |
| 2010/0237254 A1 | 9/2010 | Mason et al. | |
| 2011/0278467 A1 | 11/2011 | Tanaka | |
| 2016/0052802 A1 | 2/2016 | Ochi et al. | |
| 2017/0296690 A1 | 10/2017 | Matsui et al. | |
| 2018/0113066 A1* | 4/2018 | Freitag | C12M 23/48 |

FOREIGN PATENT DOCUMENTS

| | | |
|---|---|---|
| JP | H0997988 A | 4/1997 |
| JP | H1187770 A | 3/1999 |
| JP | 2009065128 A | 3/2009 |
| JP | 2009532200 A | 9/2009 |
| JP | 2010194414 A | 9/2010 |
| JP | 2012115715 A | 6/2012 |
| JP | 2014233646 A | 12/2014 |
| JP | 2015091582 A | 5/2015 |
| JP | 2015174026 A | 10/2015 |
| JP | 2016064111 A | 4/2016 |
| WO | 2007113537 A1 | 10/2007 |

OTHER PUBLICATIONS

International Search Report issued in Intl. Appln. No. PCT/JP2017/030340 dated Nov. 28, 2017. English translation provided.

Written Opinion of the International Searching Authority issued in Intl. Appln. No. PCT/JP2017/030340 dated Nov. 28, 2017.

Written Opinion of the International Preliminary Examining Authority issued in Intl. Appln. No. PCT/JP2017/030340 dated Oct. 23, 2018.

Office Action issued in Japanese Appln. No. 2018-538350 dated Dec. 8, 2020. English machine translation provided.

Office Action filed in Taiwanese Appln. No. 106130082 dated Mar. 31, 2021. English machine translation provided.

Office Action filed in Chinese Appln. No. 201780055405.7 dated Apr. 12, 2021. English machine translation provided.

JAVA. "Structural Analysis and Design of Chemical Equipment." Sinopec Press. Aug. 1991. 6 pages. Cited in NPL 2. English abstract provided.

English translation of International Preliminary Report on Patentability issued in International Appln. No. PCT/JP2017/030340 dated Mar. 14, 2019.

* cited by examiner

ULTRAVIOLET IRRADIATION DEVICE AND METHOD

TECHNICAL FIELD

The present invention relates to ultraviolet irradiation devices and method for carrying out ultraviolet treatment on liquid to be treated (to-be-treated liquid) by use of an ultraviolet light-emitting diode (UV-LED), and more particularly to a technique to efficiently cool, with a simple construction, heat generated from the ultraviolet light-emitting diode. The present invention can be applied to a technical field in which to-be-treated liquid, such as ultra-pure water, pure water, clear water and foul water, is irradiated with ultraviolet rays in order to accomplish deactivation of organisms, decomposition of organic substances or the like. Further, the present invention can be applied to a technical field of photochemical reaction, such as photonitrosation, photochlorination, etc., that is carried out in chemical factories for manufacturing chemicals, such as medicine and agrichemicals.

BACKGROUND ART

Conventionally, a device containing heat-generating elements such as semiconductor elements employs a radiator or heat sink for cooling. In an ultraviolet irradiation device which employs an ultraviolet light-emitting diode as a light source, it is also necessary to implement suitable means for cooling or heat radiation. Patent Literature 1 below discloses a device that is configured to introduce therein dedicated cooling fluid for cooling the ultraviolet light-emitting diode. In addition, as for an apparatus for irradiating to-be-treated liquid placed in a pressured environment with ultraviolet rays, predetermined pressure resistance is required in a light source which is accommodated in the apparatus in such a manner as to contact the to-be-treated liquid placed in the pressured environment. Patent Literature 2 below discloses a device that is configured to transmit ultraviolet rays, which are generated an ultraviolet source such as the ultraviolet light-emitting diode, to a location capable of contacting the to-be-treated liquid under the pressured environment via optical fibers.

Patent Literature 1: Japanese Patent Application Laid-open Publication No. 2009-65128

Patent Literature 2: Japanese Patent Application Laid-open Publication No. 2016-64111

Because the device disclosed in Patent Literature 1 has to be configured so as to introduce therein the dedicated cooling fluid for cooling the ultraviolet light-emitting diode, it brings some problems such as complication of a device construction and high costs. As for the device disclosed in Patent Literature 2, there is no problem of pressure tightness because the predetermined pressure resistance is not required in the ultraviolet source of the device by such an arrangement that the ultraviolet source, such as the ultraviolet light-emitting diode, is placed at a position distant from the to-be-treated liquid under the pressured environment. In Patent Literature 2, however, there is no disclosure about an idea of cooling the ultraviolet source such as the ultraviolet light-emitting diode. Therefore, in order for cooling the ultraviolet source such as the ultraviolet light-emitting diode, the device disclosed in Patent Literature 2 would have to employ the dedicated cooling fluid for cooling the ultraviolet light-emitting diodes similarly to the device disclosed in Patent Literature 1, for example.

SUMMARY OF INVENTION

In view of the foregoing problems, it is one of objects of the present invention to provide an ultraviolet irradiation device, to be used for ultraviolet treatment carried out on to-be-treated liquid by use of an ultraviolet light-emitting diode, which can efficiently cool, with a simple construction, heat generated from the ultraviolet light-emitting diode.

In order to accomplish the aforementioned object, an inventive ultraviolet irradiation device includes: a housing having an open end and an ultraviolet-transparent closing end; and an ultraviolet light-emitting diode accommodated in the housing, wherein a portion of the housing adjacent to the ultraviolet-transparent closing end contacts to-be-treated liquid, ultraviolet rays generated from the ultraviolet light-emitting diode are irradiated to the to-be-treated liquid, and the housing is cooled by the to-be-treated liquid.

According to the inventive ultraviolet irradiation device, the housing accommodating therein the ultraviolet light-emitting diode contacts the to-be-treated liquid, so that the housing is cooled by the to-be-treated liquid to thereby cool the heat generated from the ultraviolet light-emitting diode accommodated in the housing. Thus, the heat generated from the ultraviolet light-emitting diode can be cooled with a simple construction without use of arrangements for introducing dedicated cooling fluid for cooling the ultraviolet light-emitting diode. Further, by providing with a heat discharge block contacting or being adjacent to the housing, it can be facilitated that the heat discharge block discharges to the outside the heat absorbed from the ultraviolet light-emitting diode by the heat discharge block because the to-be-treated liquid contacting the housing cools the heat discharge block as well as the housing.

In an embodiment, the heat discharge block for discharging outside the heat generated from the ultraviolet light-emitting diode may be provided at or adjacent to the open end of the housing. In this way, such a compact construction that the heat discharge block is provided on one end (i.e., the open end) of the housing while an ultraviolet emitting portion being formed at another end (i.e., the closing end) thereof can be provided, and efficiently cooling can be achieved, even with such a compact construction, by a combination of cooling by the to-be-treated liquid at or adjacent to the ultraviolet-transparent closing end of the housing and cooling via the heat discharge block at or adjacent to the open end of the housing.

According to another aspect, an ultraviolet irradiation method employing an ultraviolet irradiation device is provided, in which the ultraviolet irradiation device includes: a housing having an open end and an ultraviolet-transparent closing end; and an ultraviolet light-emitting diode accommodated in the housing, and the ultraviolet irradiation method comprises: irradiating to-be-treated liquid with ultraviolet rays from the ultraviolet light-emitting diode while at least a portion of the housing adjacent to the ultraviolet-transparent closing end of the housing is soaked in the to-be-treated liquid; and cooling heat generated from the ultraviolet light-emitting diode by means of the housing soaked in the to-be-treated liquid and cooled thereby.

DESCRIPTION OF EMBODIMENTS

Figure 1:
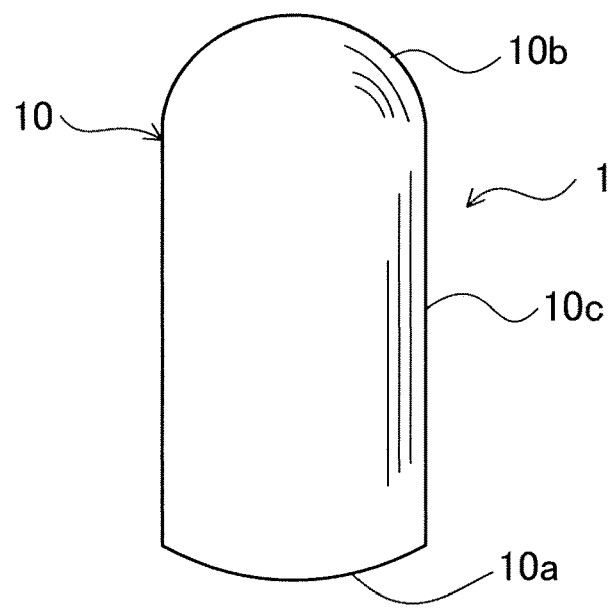
FIG. 1 is a perspective view showing an outside of an ultraviolet irradiation device according to an embodiment of the present invention.
Figure 2:
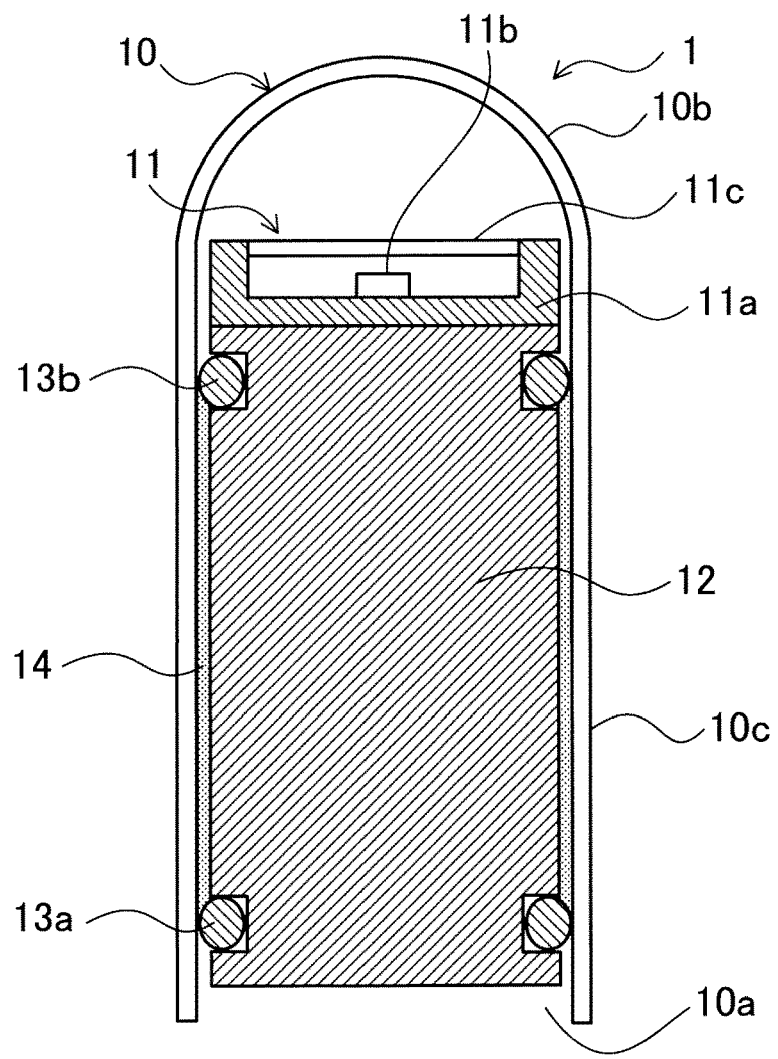
FIG. 2 is a vertical section view of the ultraviolet irradiation device as shown in FIG. 1.

FIG. 1 is a perspective view showing an outside of an ultraviolet irradiation device 1 according to an embodiment of the present invention, and FIG. 2 is a vertical section view of the ultraviolet irradiation device 1 as shown in FIG. 1. A housing 10 of the ultraviolet irradiation device 1 has an approximate cylindrical overall shape with an open end 10a positioned at a lower side in FIG. 1 and a closing end 10b of a dome shape positioned at an upper side in FIG. 1. Namely, a vertical side 10c of the housing 10 extending from the closing end 10b of the dome shape forms a cylindrical shape, and one end of the cylindrical-shaped vertical side 10c opens as the open end 10a. A heat discharge block 12 is disposed at or adjacent to the open end 10a within the housing 10, and an LED unit 11 is accommodated in the housing 10 at or adjacent to the closing end 10b. The LED unit 11 contains one or more ultraviolet light-emitting diodes 11b in a casing 11a, and a top of the casing 11a is formed by an irradiation window 11c of ultraviolet ray permeability. As known in the conventional LED units, the irradiation window 11c is of a flat plate shape. The LED unit 11 is fixedly disposed within the housing 10 in such a predetermined positional relationship that a lower surface of the casing 11a contacts the heat discharge block 12 and that the irradiation window 11c faces the closing end 10b of the housing 10. The housing 10 is composed of a material having ultraviolet transparency at least in a portion of the closing end 10b of the dome shape. For example, the housing 10 as a whole is made of quartz glass having ultraviolet transparency (or ultraviolet translucency). With such arrangements, ultraviolet rays emitted from the ultraviolet light-emitting diodes 11b of the LED unit 11 are passed through the irradiation window 11c and then irradiated to the outside through the closing end 10b of the dome shape of the housing 10. It should be noted that there is merely a simple space of short distance between the irradiation window 11c of the LED unit 11 and the closing end 10b of the dome shape, so that there is no need an optical fiber therebetween.

As described later in detail, when the ultraviolet irradiation device 1 is employed for treatment, at least the closing end 10b of the dome shape of the housing 10 contacts (or is soaked in) the to-be-treated liquid to irradiate the to-be-treated liquid with the ultraviolet rays from the ultraviolet light-emitting diodes 11b. In this way, because at least the closing end 10b of the dome shape of the housing 10 contacts (or is soaked in) the to-be-treated liquid, a portion of the housing 10 contacting the to-be-treated liquid is cooled to thereby operate so as to cool the heat generated from the ultraviolet light-emitting diodes 11b accommodated in the housing 10. Even if the housing 10 is made of quartz glass, the housing 10 can have necessary and sufficient pressure resistance ability because the housing 10 has the closing end 10b of the dome shape and the cylindrical-shaped side 10c. For example, the housing 10 can be constructed to have such pressure resistance ability over 1.0 Mpa necessary for specifications of a general water treatment apparatus.

The heat discharge block 12 has a cylindrical-shaped body, as a whole, loosely fit for an inner peripheral surface of the cylindrical-shaped side 10c of the housing 10. The heat discharge block 12 is made of a material of high thermal conductivity (such as aluminum, stainless steel, etc.), and the inside thereof need not be a complete solid but an appropriate hollow or space may be formed therein. For example, at least a space to pass the wiring for the LED unit 11 may be formed within the heat discharge block 12, and the wiring can be drawn out of the open end 10a of the housing 10. Further, the heat discharge block 12 may be composed of a main body of metal, such as aluminum, stainless steel, etc., and fluororesin coating over a surface of the main body. The heat discharge block 12 absorbs the heat generated from the LED unit 11 and discharges the absorbed heat from the open end 10a of the housing 10 to the outside. Further, the heat absorbed by the heat discharge block 12 can be discharged to the outside via the cylindrical-shaped side 10c of the housing 10 too.

Thus, with such an arrangement that the heat discharge block 12 for discharging to the outside the heat generated from the ultraviolet light-emitting diode 11b is provided at or adjacent to the open end 10a of the housing 10, a compact construction in which the heat discharge block 12 is provided on one end (i.e., the open end 10a) of the housing 10 while an ultraviolet emitting portion being formed at another end (i.e., the closing end 10b) thereof can be provided. Further, efficiently cooling can be achieved, even with such a compact construction, by a combination of cooling by the to-be-treated liquid at or adjacent to the closing end 10b of the housing 10 which contacts the to-be-treated liquid and cooling via the heat discharge block 12 at or adjacent to the open end 10a of the housing 10. Furthermore, by providing with the heat discharge block 12 contacting or being adjacent to the housing 10, it can be facilitated that the heat discharge block 12 discharges to the outside the heat absorbed from the ultraviolet light-emitting diode 11b by the heat discharge block 12 because the to-be-treated liquid contacting the housing 10 cools the heat discharge block 12 as well as the housing 10.

Because it is not avoided that there appears a gap between the inner peripheral surface of the cylindrical-shaped side 10c of the housing 10 and an outer surface of the metal-made heat discharge block 12 inserted in the housing 10, the gap between the housing 10 and the heat discharge block 12 is preferably filled with a suitable thermal conductive material 14 in order to enhance thermal conductivity between the housing 10 and the heat discharge block 12. For this purpose, two O-rings 13a, 13b are provided, at different positions, on the outer surface of the heat discharge block 12 in such a manner that the O-rings 13a. 13b are liquid-tightly close to the inner peripheral surface of the cylindrical-shaped side 10c of the housing 10 so that the gap sectioned by/between the O-rings 13a, 13b is filled with the thermal conductive material 14. For example, a fluid or semi-fluid filler material, such as water or an oil compound for heat radiation, is employed as the thermal conductive material 14 to be liquid-tightly filled between the O-rings 13a. 13b.

In this way, by the heat discharge block 12 thermally-closely contacting the housing 10 via the thermal conductive material 14, it can be more facilitated that the heat discharge block 12 discharges to the outside the heat absorbed from the ultraviolet light-emitting diode 11b by the heat discharge block 12 because the to-be-treated liquid contacting the housing 10 cools the heat discharge block 12 as well as the housing 10.

Here, an examination of a cooling effect by the heat discharge block 12 will be made as below. Assuming that a temperature of the ultraviolet light-emitting diode 11b on heating is $T_J$, a temperature of a surface of the casing 11a resulting from the heat conducted through the casing 11a from the ultraviolet light-emitting diode 11b contacting the casing 11a is $T_{Ref}$ and a temperature inclination per one watt (W) of the casing (so called "thermal resistance") is $R\theta_{J,Ref}$, the following mathematical expression can be presented:

$$R\theta_{J,Ref} = (T_J - T_{Ref})/P \quad \text{(Expression 1)},$$

where P denotes a consumed electrical power. Assuming that the value of $R\theta_{J,Ref}$ of a commercially available UV-LED to be used as the ultraviolet light-emitting diode 11b in the embodiment is 150° C./W, in order to cool the UV-LED of 0.13 W (namely, a 0.13-watt LED) to keep its temperature below 80° C., the following mathematical expression can be derived from the expression 1:

$$150° \text{C./W} = (80° \text{C.} - T_{Ref})/0.13W,$$

and then the solution of $T_{Ref}$ is obtained as "$T_{Ref} = 60.5°$ C.". Therefore, it is necessary to perform cooling such that the temperature $T_{Ref}$ of the surface of the casing becomes equal to or less than 60.5° C.

Here, assuming a temperature of the to-be-treated liquid (e.g., water) participating in the cooling is $T_W °$ C., the cooling capacity of the heat discharge block 12 can be approximated by the following mathematical expression:

$$(T_{Ref} - T_W)/T_{Ref} = 0.9^L \quad \text{(Expression 2)},$$

where L (measured in "cm") is a length of a cooling stick and L is an exponent factor attached to a base factor "0.9". Note that the value "0.9" of the base factor indicates discharge characteristics of the heat discharge block 12, and that the specific value "0.9" of the base factor as shown in the expression 2 is only an example of such a value that is peculiar to the material of the heat discharge block 12. In the case of the expression 2, when the temperature of the to-be-treated liquid (e.g., water) is 25° C., L would be 5.06 cm. In other words, based on previously carrying out an experience for determining an actual value, for each of materials to be used for the heat discharge block 12, to replace the specific value "0.9" of the base factor as shown in the expression 2, a specific length L of the heat discharge block 12 of each material can be easily determined.

Note that the number of the LED unit 11 accommodated in the housing 10 is not limited to one and it may be plural. Further, the number of the ultraviolet light-emitting diode 11b provided in the LED unit 11 is not limited to one and it may be plural. The shape of the casing 11a of the LED unit 11 may be any shape such as a round or a rectangle. Needless to say, without using an existent or commercial LED unit as the LED unit 11, the ultraviolet light-emitting diode 11b may be directly accommodated in the housing 10 with a suitable arrangement. In such a case, the irradiation window 11c may not be necessarily provided.

Figures 3A, 3B:
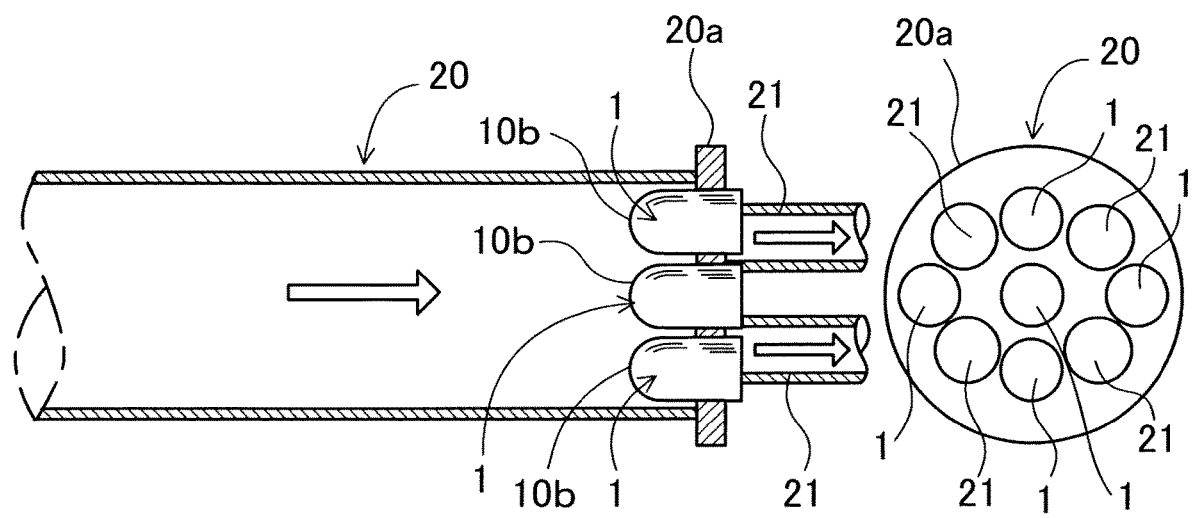
FIGS. 3A and 3B are schematic views showing a usage example of the inventive ultraviolet irradiation device.

FIG. 3 is a schematic view showing a usage example of the ultraviolet irradiation device 1; in which FIG. 3A is a schematic vertical section view of a treatment tank 20, and FIG. 3B is an end view of the treatment tank 20. In an embodiment, the treatment tank 20 is a pressure resistant container of a cylindrical shape, and, as shown in FIG. 3A, the to-be-treated liquid flowed thereinto from a not-shown inlet pipe path flows in an arrow direction so as to be discharged from a discharge pipe path 21 provided at one end 20a of the treatment tank 20. As shown in FIG. 3B, four discharge pipe paths 21, for example, are provided on the one end 20a of the treatment tank 20 at constant intervals in a circular direction, and five ultraviolet irradiation devices 1, for example, are attached thereto at suitable intervals with the dome-shaped closing ends 10b of respective housings 10 directed inwardly. In this way, at the time of use, at least the dome-shaped closing ends 10b and its adjacent portions of respective housings 10 in the respective ultraviolet irradiation devices 1 face the inside of the treatment tank 20 and contact (or are soaked in) the to-be-treated liquid, so that the to-be-treated liquid in the treatment tank 20 is irradiated with the ultraviolet rays emitted from the ultraviolet light-emitting diodes 11b to perform the ultraviolet treatment of the to-be-treated liquid. Additionally, because cooling by the to-be-treated liquid about the closing ends 10b of the housings 10 that contact the to-be-treated liquid is carried out, the heat generated from the ultraviolet light-emitting diodes 11b can be cooled efficiently.

Figures 4A, 4B:
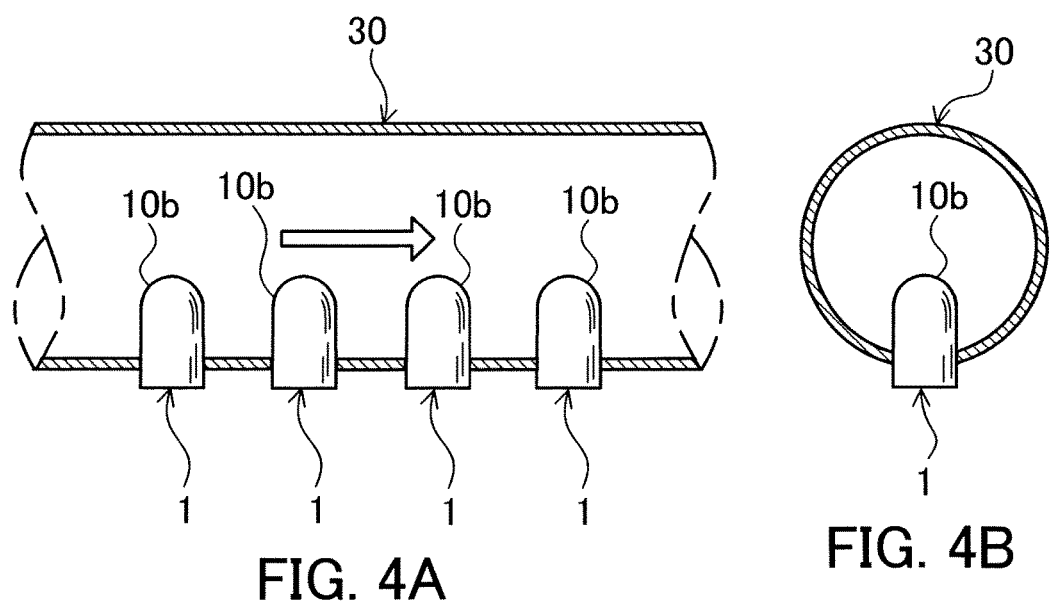
FIGS. 4A and 4B are schematic views showing another usage example of the inventive ultraviolet irradiation device.

FIG. 4 shows another usage example of the ultraviolet irradiation device 1 in which a plurality of ultraviolet irradiation devices 1 are provided on a peripheral side of a treatment tank 30 that is a pressure resistant container of a cylindrical shape. FIG. 4A is a schematic vertical section view of a treatment tank 30, and FIG. 4B is a schematic traverse section view of the treatment tank 30. The plurality of ultraviolet irradiation devices 1 provided on the peripheral side of the treatment tank 30 are disposed thereon at suitable intervals with the dome-shaped closing ends 10b of respective housings 10 directed inwardly. The to-be-treated liquid flowed into the treatment tank 30 from a not-shown inlet pipe path flows in an arrow direction, and at least the dome-shaped closing ends 10b and its adjacent portions of respective housings 10 in the respective ultraviolet irradiation devices 1 face the inside of the treatment tank 30 and contact the to-be-treated liquid. Thus, the to-be-treated liquid in the treatment tank 30 is irradiated with the ultraviolet rays emitted from the ultraviolet light-emitting diodes 11b to perform the ultraviolet treatment of the to-be-treated liquid. In this case too, because cooling by the to-be-treated liquid about the closing ends 10b of the housings 10 that contact the to-be-treated liquid is carried out, the heat generated from the ultraviolet light-emitting diodes 11b can be cooled efficiently.

Figure 5:
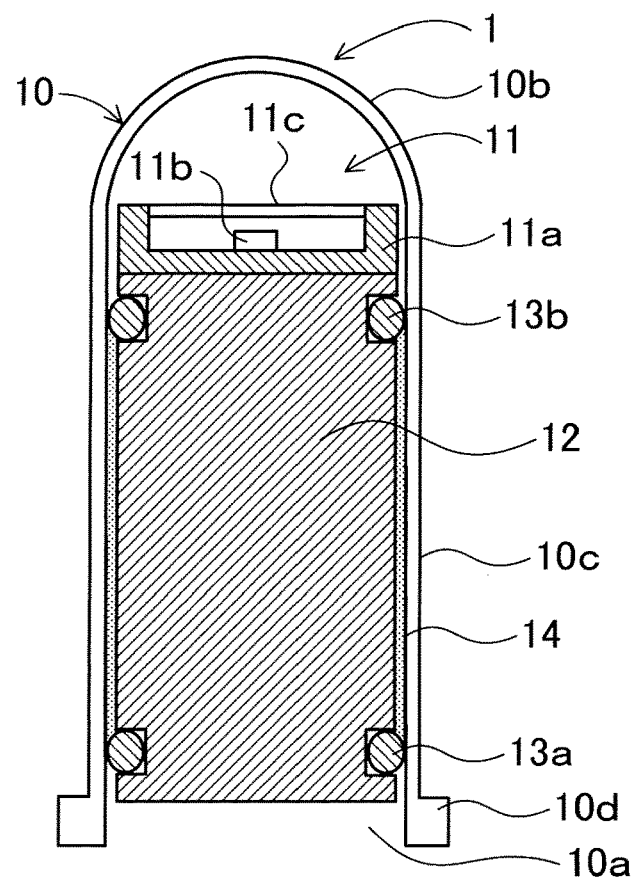
FIG. 5 is a vertical section view of another embodiment of the inventive ultraviolet irradiation device.

The specific construction of the inventive ultraviolet irradiation device 1 is not limited to such a construction as shown in FIGS. 1 and 2, and various modifications can be applied thereto. FIG. 5 is a vertical section view of another embodiment of the inventive ultraviolet irradiation device 1, in which the shape of the housing 10 as shown in FIG. 5 is slightly different from the shape as shown in FIG. 2. Namely, the housing 10 as shown in FIG. 5 includes a flange 10d around the opening end 10a so that a portion of the flange 10d is caught on an outer wall surface of the treatment tank 20 or 30 to stay at the outside. With such an arrangement, in case the inside of the treatment tank 20 or 30 becomes a state of negative pressure, it is capable of preventing the ultraviolet irradiation device 1 from being drawn thereinto. In FIG. 5, other constituent elements than the flange 10*d* are the same as in FIG. 2, and these same constituent elements will not be described in detail here to avoid unnecessary duplication.

Figure 6:
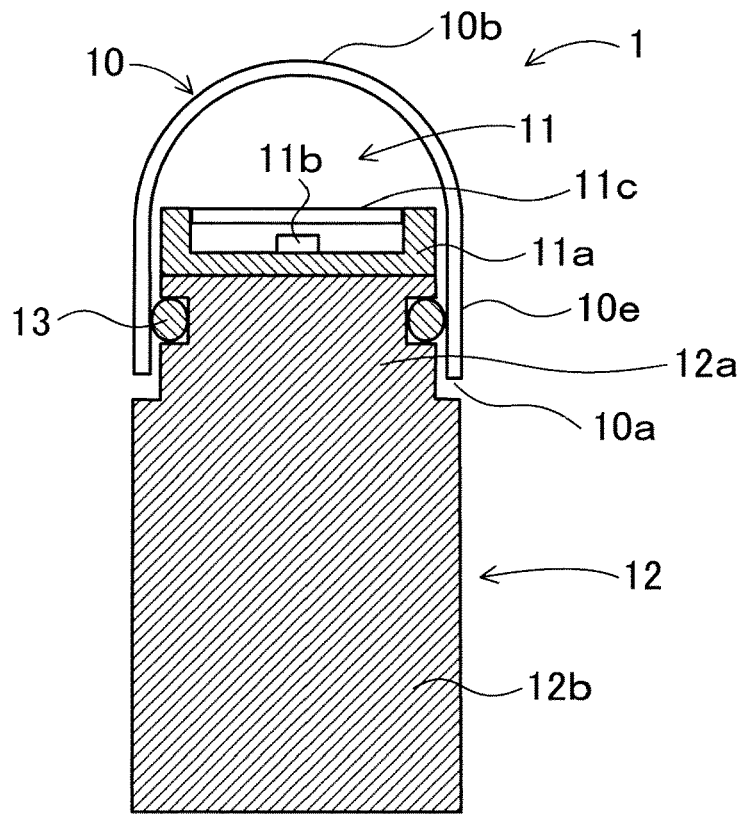
FIG. 6 is a vertical section view of still another embodiment of the inventive ultraviolet irradiation device.

FIG. 6 is a vertical section view of still another embodiment of the inventive ultraviolet irradiation device 1, in which a relationship between the housing 10 and the heat discharge block 12 is different from a relationship between the housing 10 and the heat discharge block 12 as shown in FIG. 2. In FIG. 6, a length of a vertical side 10*e* of the housing 10 is shorter than the vertical side 10*c* as shown in FIG. 2, only a portion 12*a* of the heat discharge block 12 is inserted in the housing 10, and a remaining portion 12*b* of the heat discharge block 12 is exposed to the outside from the open end 10*a* of the housing 10. An O-ring 13 is attached to the heat discharge block 12 at only one position in such a manner that the O-ring 13 is liquid-tightly close to the inner peripheral surface of the vertical side 10*e* of the housing 10 so as to keep an inner space of the housing, where the LED unit 11 is placed, liquid-tight. With this arrangement, at the time of use, the remaining portion 12*b* of the heat discharge block 12 exposed from the open end 10*a* of the housing 10 is located in the treatment tank 20 or 30 to thereby contact the to-be-treated liquid that flows in the treatment tank 20 or 30, so that the heat discharge block 12 is cooled directly by the to-be-treated liquid. For this reason, according to the embodiment as shown in FIG. 6, there is no need to provide with such the thermal conductive material 14 as shown in FIG. 2. Note that, as for the heat discharge block 12 of a cylindrical shape in whole, as shown in FIG. 6, an outer diameter of the portion 12*b* exposed from the open end 10*a* of the housing 10 is suitably larger than the portion 10*a* to be inserted in the housing 10 in such a way to approximately consist with an outer diameter of the vertical side 10*e* of the housing 10.

Figure 7:
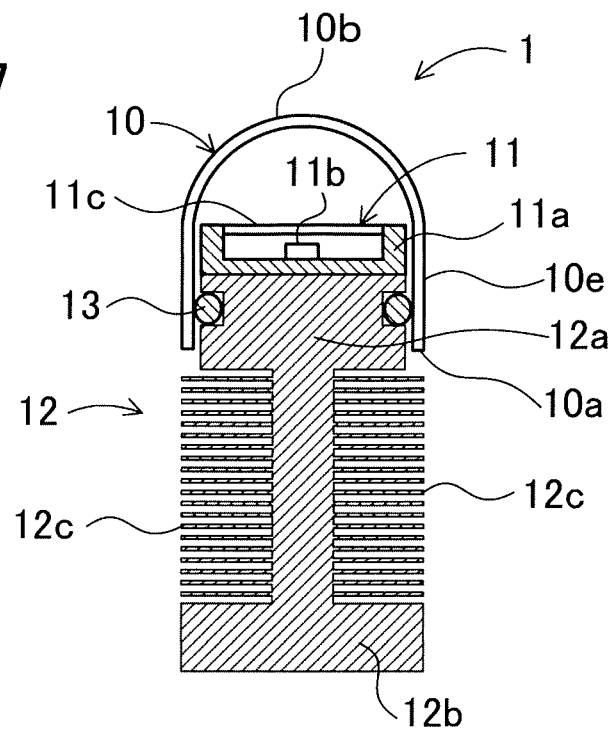
FIG. 7 is a vertical section view showing a modification of a heat discharge block to be used in the embodiment of the inventive ultraviolet irradiation device.

FIG. 7 is a vertical section view showing a modification of the heat discharge block 12 to be used in the embodiment of the inventive ultraviolet irradiation device 1. In FIG. 7, similarly to the example shown in FIG. 6, the heat discharge block 12 inserts only one portion 12*a* in the housing 10 and exposes a remaining portion 12*b* to the outside from the open end 10*a* of the housing 10. As for a difference from FIG. 6, in FIG. 7, the exposed portion 12*b* of the heat discharge block 12 forms multiple fins 12*c* so that a surface area thereof is enlarged to enhance heat exchange efficiency. It should be noted that the exposed portion 12*b* of the heat discharge block 12 is not limited to the fins 12*c* and may have such a suitable radiator construction that a surface area thereof can be enlarged.

Figure 8:
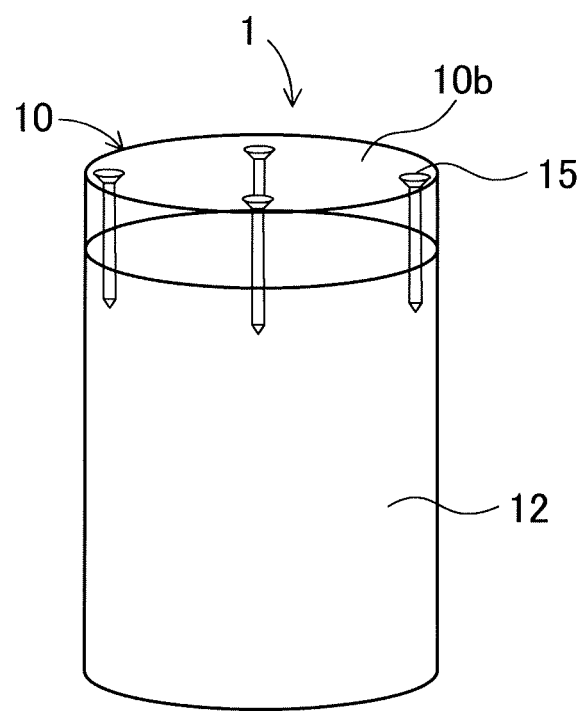
FIG. 8 is a perspective view showing an outside of further embodiment of the inventive ultraviolet irradiation device.
Figure 9:
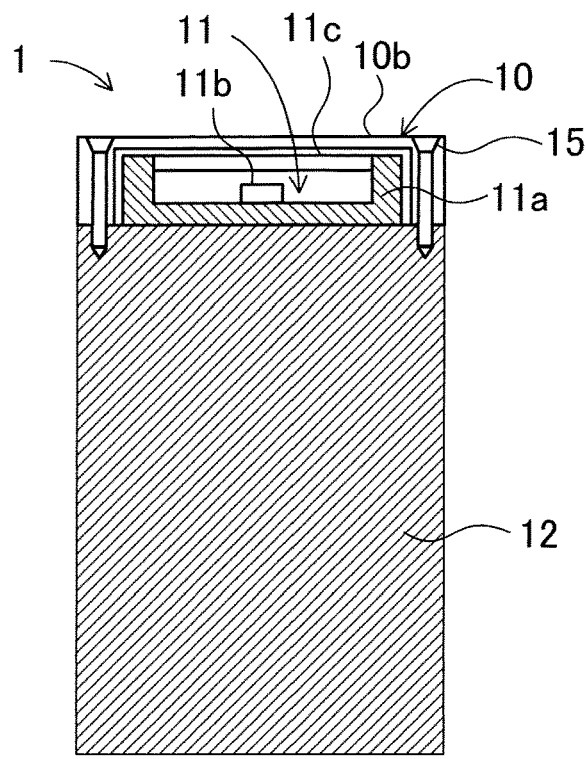
FIG. 9 is a vertical section view of the ultraviolet irradiation device as shown in FIG. 8.

FIG. 8 is a perspective view showing an outside of further embodiment of the inventive ultraviolet irradiation device 1 and FIG. 9 is a vertical section view of the ultraviolet irradiation device 1 as shown in FIG. 8. In the embodiment of FIG. 8, the housing 10 is made of a fluororesin material having ultraviolet-ray-transparency rather than the quartz glass and can bear a necessary pressure resistance (equal to or more than 1.0 Mpa) by the material itself without forming any special shape such as a dome. Thus, in the embodiment shown in FIGS. 8 and 9, the closing end 10*b* of the housing 10 forms a flat surface rather than the dome shape. Further, the housing 10 made of fluororesin can easily fixed on the heat discharge block 12 by means of a plurality of screws 15 because of facility of processing. Similarly to the aforementioned embodiments, the LED unit 11 for emitting the UV rays is accommodated in the housing 10.

Figure 10:
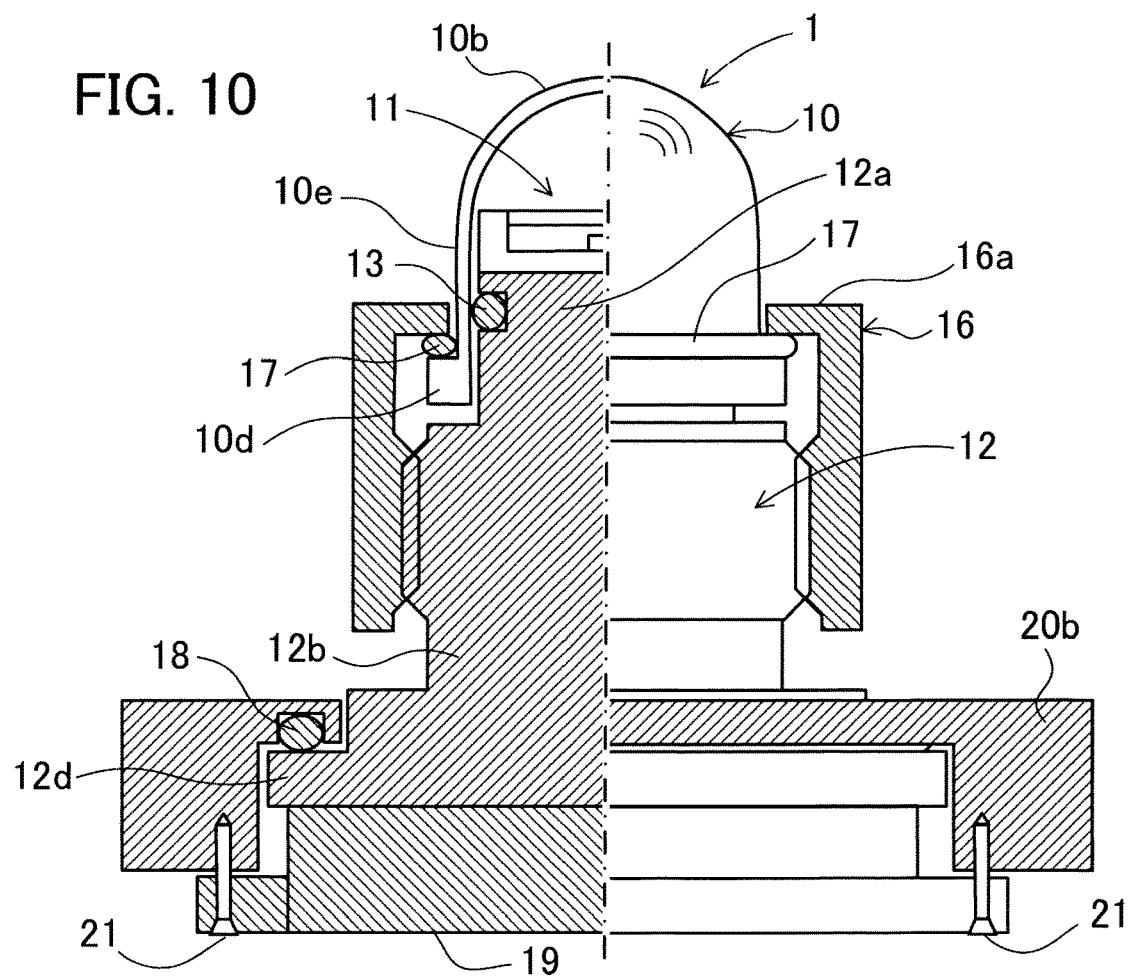
FIG. 10 is a partial-section side view showing an example of a construction attaching the inventive ultraviolet irradiation device to a treatment tank.

FIG. 10 is a partial-section side view showing a specific example of a construction attaching the ultraviolet irradiation device 1 to the treatment tank 20 (or 30). In FIG. 10, the housing 10 of the ultraviolet irradiation device 1 has a flange 10*d* similar to the one as shown in FIG. 5, but a vertical side 10*e* of the housing 10 in FIG. 10 is relatively short like the one as shown in FIG. 6. The ultraviolet irradiation device 1 shown in FIG. 10 has no thermal conductive material 14. Instead, the heat discharge block 12 directly contacts the to-be-treated liquid in the treatment tank 20 (or 30) to thereby cool the heat discharge block 12. Namely, only a portion 12*a* of the heat discharge block 12 is inserted in the housing 10, and a remaining portion 12*b* of the heat discharge block 12 is exposed to the outside from the open end 10*a* of the housing 10. An O-ring 13 is attached to the heat discharge block 12 at only one position in such a manner that the O-ring 13 is liquid-tightly close to the inner peripheral surface of the vertical side 10*e* of the housing 10 so as to keep an inner space of the housing, where the LED unit 11 is placed, liquid-tight.

In FIG. 10, an outer peripheral of the exposed portion 12*b* of the heat discharge block 12 provides with an outer screw thread that is coupled to an inner screw thread provided on an inner peripheral of a collar 16. An upper portion of the collar 16 forms a flange 16*a* having an inward-contracted diameter. The flange 16*a* is capable of abutting, via a packing 17, on the flange 10*d* provided on the open end of the housing 10 and having an outward-expanded diameter. Thus, by rotating the collar 16 to tighten the screw, the flange 10*d* of the housing 10 becomes to be caught by the flange 16*a* of the collar 16 via the packing 17, so that the housing never slips through the heat discharge block 12 even if a negative pressure is occurred in the treatment tank 20 (or 30).

In FIG. 10, another end of the heat discharge block 12 forms a flange 12*d* projecting outward in a radial direction, and the flange 12*d* liquid-tightly couples, via a packing 18, to a seat portion defined around an attachment hole that is bored at a predetermined attachment position 20*b* (in a wall) of the treatment tank 20 (or 30). An end plate 19 pushes the flange 12*d* of the heat discharge block 12 from the outside in a state where the end plate 19 is firmly fixed to the attachment position 20*b* (in the wall) of the treatment tank 20 (or 30) by means of a plurality of screws 21. In this way, the ultraviolet irradiation device 1 is liquid-tightly attached to the predetermined attachment position 20*b* (in the wall) of the treatment tank 20 (or 30). Needless to say, an attachment structure of the ultraviolet irradiation device 1 to the treatment tank 20 (or 30) is not limited to such a structure as shown in FIG. 10, and any other structures can be employed therefor.

What is claimed is:

1. An ultraviolet irradiation device comprising:
   a housing having an open end and a closed end of ultraviolet transparency;
   a light-emitting diode unit accommodated in the housing and including a casing having an irradiation widow and an ultraviolet light-emitting diode accommodated in the casing, the ultraviolet light-emitting diode being configured to emit ultraviolet rays through the irradiation window of the casing and through the closed end of the housing to treat to-be-treated-liquid disposed outside the housing; and
   a heat discharge block accommodated in the housing such that the heat discharge block is disposed between the open end of the housing and the light-emitting diode unit.

2. The ultraviolet irradiation device as claimed in claim 1, further comprising:

a thermal conductive substance that is filled between the housing and the heat discharge block.

3. The ultraviolet irradiation device as claimed in claim 2, wherein the thermal conductive substance comprises water or an oil compound for heat radiation that is liquid-tightly filled in at least a portion of a gap between the housing and the heat discharge block.

4. The ultraviolet irradiation device as claimed in claim 1, wherein a portion of the heat discharge block directly contacts the to-be-treated liquid.

5. The ultraviolet irradiation device as claimed in claim 1, wherein the heat discharge block includes a fin structure or a radiator structure.

6. The ultraviolet irradiation device as claimed in claim 1, wherein the housing has a pressure resistant structure.

7. The ultraviolet irradiation device as claimed in claim 6, wherein the closed end of the housing forms a dome shape.

8. The ultraviolet irradiation device as claimed in claim 1, wherein the housing includes a flange provided around the open end of the housing, and
wherein the ultraviolet irradiation device is configured to be arranged in a container containing therein the to-be-treated-liquid in such a manner that the open end of the housing is fixed via the flange to a portion of the container with the closed end of the housing projecting into the container.

9. The ultraviolet irradiation device as claimed in claim 8, further comprising a collar having an inner screw thread,
wherein the heat discharge block has an outer screw thread configured to be screw-coupled to the inner screw thread of the collar,
wherein an upper portion of the collar forms a second flange having an inward-contracted diameter, and
wherein the flange provided around the open end of the housing has an outward-expanded diameter configured to abut on the second flange of the collar.

10. An ultraviolet irradiation method employing an ultraviolet irradiation device that includes: a housing having an open end and a closed end of ultraviolet transparency; a light-emitting diode unit accommodated in the housing and including a casing having an irradiation widow and an ultraviolet light-emitting diode accommodated in the casing, the ultraviolet light-emitting diode being configured to emit ultraviolet rays through the closed end of the housing to treat to-be-treated-liquid disposed outside the housing; and a heat discharge block accommodated in the housing such that the heat discharge block is disposed between the open end of the housing and the light-emitting diode unit, the ultraviolet irradiation method comprising:
arranging the ultraviolet irradiation device in a container containing therein the to-be-treated-liquid in such a manner that the ultraviolet irradiation device is fixed to the container, via a portion of a body of the heat discharge block adjacent to a distal end of the body disposed farthest from the closed end of the housing, with the closed end of the housing projected into the container; and
irradiating the to-be-treated liquid in the container with ultraviolet rays emitted from the ultraviolet light-emitting diode while at least the closed end of the housing contacts the to-be-treated liquid in the container,
wherein heat generated from the ultraviolet light-emitting diode is cooled by the housing being cooled by contacting with the to-be-treated liquid, and heat conducted through the housing is discharged via the heat discharge block.

* * * * *